US010727190B2

(12) United States Patent
Curtis

(10) Patent No.: US 10,727,190 B2
(45) Date of Patent: Jul. 28, 2020

(54) COMPOUND VIA RF TRANSITION STRUCTURE IN A MULTILAYER HIGH-DENSITY INTERCONNECT

(71) Applicant: Tektronix, Inc., Beaverton, OR (US)

(72) Inventor: George S. Curtis, Lake Oswego, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 16/234,483

(22) Filed: Dec. 27, 2018

(65) Prior Publication Data

US 2020/0211986 A1    Jul. 2, 2020

(51) Int. Cl.
| | |
|---|---|
| *H01L 23/66* | (2006.01) |
| *H05K 1/11* | (2006.01) |
| *H05K 1/02* | (2006.01) |
| *H01L 23/498* | (2006.01) |

(52) U.S. Cl.
CPC ........ *H01L 23/66* (2013.01); *H01L 23/49827* (2013.01); *H05K 1/0222* (2013.01); *H05K 1/0225* (2013.01); *H05K 1/116* (2013.01); *H01L 2223/6622* (2013.01); *H01L 2223/6638* (2013.01)

(58) Field of Classification Search
CPC .... H05K 1/114; H05K 1/0225; H05K 1/0222; H05K 1/116; H05K 1/026; H05K 1/0251; H05K 2201/096; H05K 2201/0979; H05K 2201/09809; H05K 2201/09718; H05K 2201/09363; H05K 2201/093; H01L 23/66; H01L 23/49827; H01L 2223/6638; H01L 2223/6622
See application file for complete search history.

(56) References Cited

U.S. PATENT DOCUMENTS

| | | | | |
|---|---|---|---|---|
| 7,045,719 | B1* | 5/2006 | Alexander | H05K 1/0251 |
| | | | | 174/262 |
| 9,730,313 | B2* | 8/2017 | Gailus | H05K 1/0222 |
| 10,194,524 | B1* | 1/2019 | Park | H05K 1/0218 |
| 2004/0169198 | A1* | 9/2004 | Nagata | H01L 23/49822 |
| | | | | 257/200 |
| 2005/0156319 | A1* | 7/2005 | Oggioni | H01L 23/49827 |
| | | | | 257/774 |
| 2005/0191785 | A1* | 9/2005 | Howard | H01L 23/49827 |
| | | | | 438/106 |
| 2008/0218985 | A1* | 9/2008 | Takeda | H05K 1/0222 |
| | | | | 361/768 |

(Continued)

*Primary Examiner* — Roshn K Varghese
(74) *Attorney, Agent, or Firm* — Miller Nash Graham & Dunn; Andrew J. Harrington

(57) ABSTRACT

A multilayer circuit board having a central conductor and core layers between a first set of alternating layers and a second set of alternating layers. The central conductor includes a first compound via through the first set of alternating layers, and a second compound via through the second set of alternating layers. A gap extends from a first side of the multilayer circuit board to a second side of the multilayer circuit board. A first array of ground protrusions surrounds the gap and is arranged in a first pattern on the first side of the multilayer circuit board. A second array of ground protrusions surrounds the gap and is arranged in a second pattern on the second side of the multilayer circuit board. A ground path connects the first array of ground protrusions to the second array of ground protrusions.

8 Claims, 14 Drawing Sheets

(56) References Cited

U.S. PATENT DOCUMENTS

| | | | |
|---|---|---|---|
| 2008/0237893 A1* | 10/2008 | Quach | H01L 23/49816 257/781 |
| 2012/0306597 A1* | 12/2012 | Kushta | H05K 1/0222 333/204 |
| 2013/0077268 A1* | 3/2013 | Brunker | H05K 1/024 361/752 |
| 2014/0048323 A1* | 2/2014 | Wada | H01L 23/49827 174/262 |
| 2016/0007496 A1* | 1/2016 | Kim | H05K 7/02 361/2 |
| 2016/0358866 A1* | 12/2016 | Zu | H01L 23/66 |

* cited by examiner

| Region Type | Layer Number | Material Type |
|---|---|---|
|  |  | Soldermask |
| 1st (Top) Buildup Region | n+1 | Optional Conductor |
|  |  | Optional BU |
|  | n | Optional Conductor |
|  |  | Optional BU |
|  | 6 | Conductor |
|  |  | BU |
|  | 5 | Conductor |
|  |  | BU |
|  | 4 | Conductor |
|  |  | BU |
|  | 3 | Conductor |
|  |  | BU |
|  | 2 | Conductor |
|  |  | BU |
|  | 1 | Conductor |
|  |  | BU |
| Core | n | Optional Conductor |
|  |  | Optional Core |
|  | 1 | Conductor |
|  |  | Core |
|  | 2 | Conductor |
|  |  | Optional Core |
|  | n+1 | Optional Conductor |
| 2nd (Bottom) Buildup Region |  | BU |
|  | 1 | Conductor |
|  |  | BU |
|  | 2 | Conductor |
|  |  | BU |
|  | 3 | Conductor |
|  |  | BU |
|  | 4 | Conductor |
|  |  | BU |
|  | 5 | Conductor |
|  |  | BU |
|  | 6 | Conductor |
|  |  | Optional BU |
|  | n | Optional Conductor |
|  |  | Optional BU |
|  | n+1 | Optional Conductor |
|  |  | soldermask |

FIG. 6

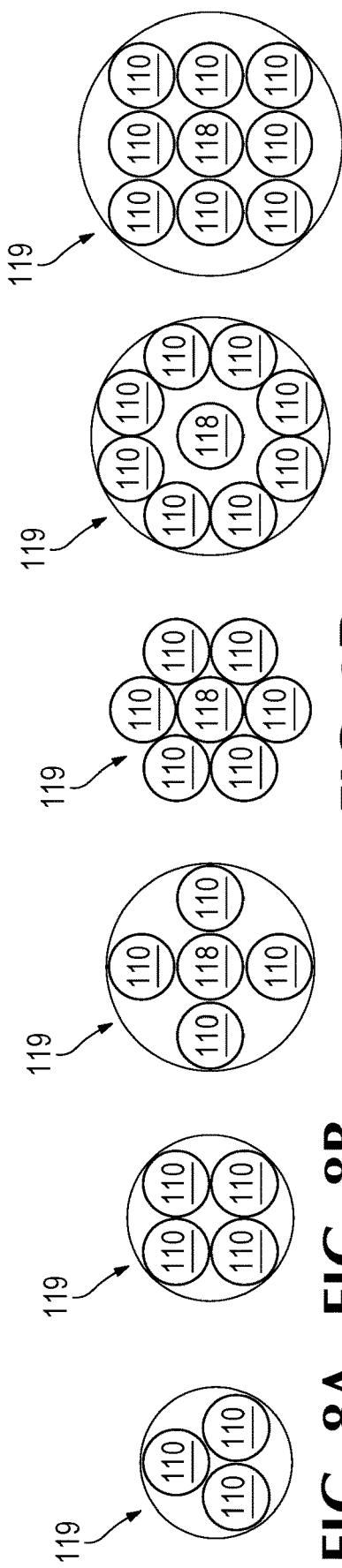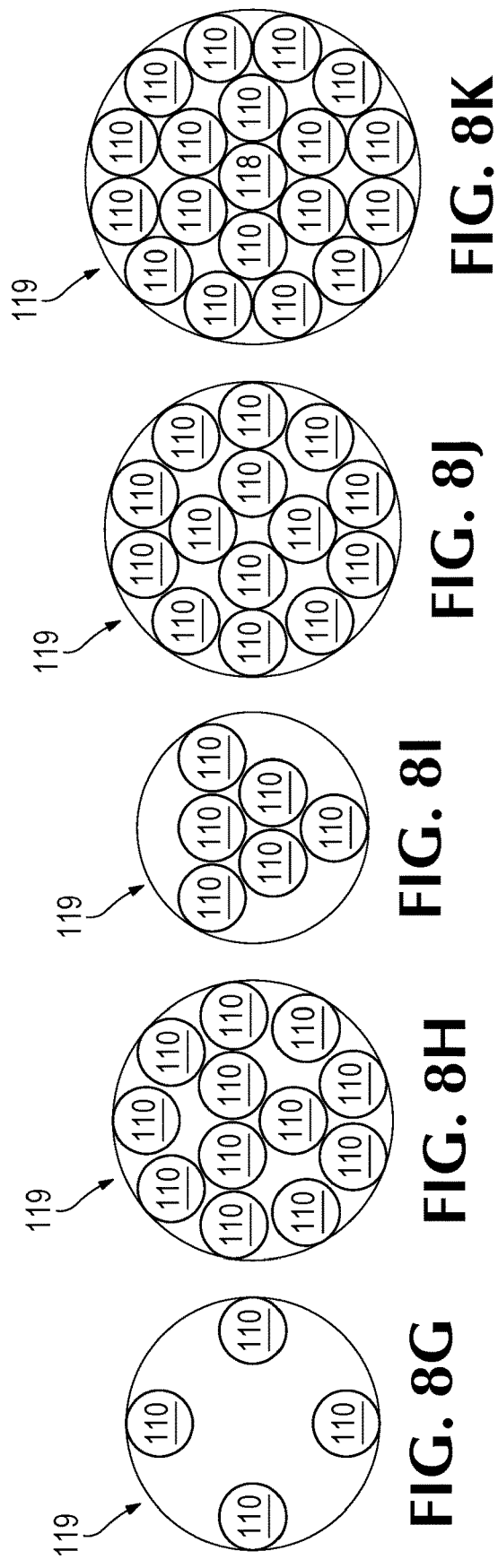

US 10,727,190 B2

COMPOUND VIA RF TRANSITION STRUCTURE IN A MULTILAYER HIGH-DENSITY INTERCONNECT

TECHNICAL FIELD

This disclosure is related to methods and devices for mounting semiconductor devices, and particularly, methods and devices for mounting radio-frequency (RF) assemblies to circuit boards.

BACKGROUND

There are a number of methods used to mount modern semiconductor devices.

A flip chip is an integrated circuit (or other semiconductor device) that is connected to other circuitry, such as a circuit board or another integrated circuit, through solder bumps, balls, or other protrusions deposited onto pads of the integrated circuit. The solder is generally deposited on the top side of the integrated circuit during processing, and the integrated circuit is then flipped over to align the pads of the integrated circuit to pads on the other circuitry to which the integrated circuit will be connected. Next, the solder is often re-melted to bond the integrated circuit to the other circuitry.

A ball grid array (BGA) is a type of device packaging that is used to surface mount semiconductor devices to, for example, printed circuit boards. In a BGA package, one face of the semiconductor device has pads in a grid pattern, and each pad includes a solder ball or other protrusion. To join the semiconductor device to the printed circuit board, the pads of the semiconductor device are aligned with corresponding pads on the printed circuit board, and the solder is melted, cooled, and solidified to permanently join the components.

A multilayer circuit board generally has a number of different layers or planes, the individual layers functioning as signal layers, ground layers, power layers, or mixed use as examples. The different layers may be connected by vias, allowing a signal to be transmitted through the layers, in a direction that is generally perpendicular to the layers.

High frequency signals are generally propagated from a signal source to a load using conductors in a coaxial arrangement where the center conductor is generally considered to carry the signal current. Signal current must return to the signal source and the outer conductor of the coaxial structure provides a tightly coupled return path. The outer conductor is usually at ground potential and is commonly referred to as "ground." Tightly coupling the return current path to the signal helps prevent signal transmission or radiation to undesired locations thus "shielding" the signal from external objects. Other arrangements are used. For example, a common structure known as "twinax" uses two signal conductors and surrounds the signal conductors with a conductive "shield" and is generally used for differential signals. In still other arrangements, more than two signal conductors are used. Another variation is when the signal return is at a potential other than the circuit ground reference voltage Embodiments of the disclosed technology address shortcomings in the prior art.

BRIEF DESCRIPTION OF THE DRAWINGS

FIG. 6 is a table showing certain layer properties of an exemplary multilayer circuit board, according to embodiments.

FIGS. 8A-8K are cross-sectional views showing example configurations for compound vias, according to embodiments.

DETAILED DESCRIPTION

Figure 1:
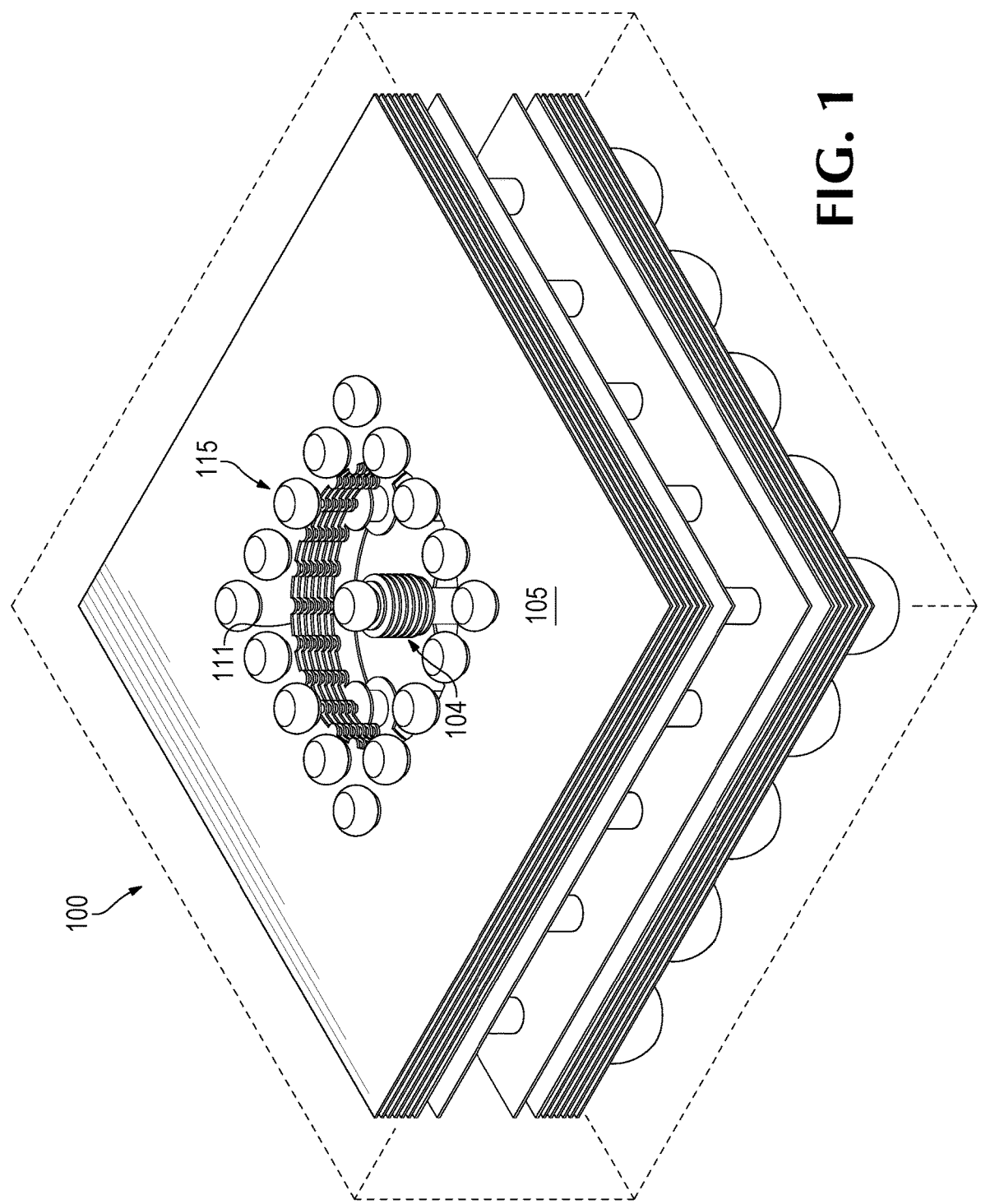
FIG. 1 is a top isometric view of a multilayer circuit board, according to embodiments.

High frequency (e.g., RF) signal transmission through a device package is challenging given current conventional packaging processes and electronic component assembly process technology. For example, in a semiconductor BGA device package, high frequency signal fidelity is limited by the deviation of signal path impedance from optimal, and affected by ball-to-ball capacitance, core via pitch, minimum pad size, core via drill size, dielectric via size, maximum via stack and other factors. Smaller balls sizes might theoretically be used to reduce ball-to-ball capacitance, but to keep costs low, electronic component assembly facilities may specify minimum ball sizes that are larger than the sizes that would be theoretically needed for good RF signal performance greater than 30 GHz. As described herein, embodiments may enable a higher signal bandwidth for a given ball size (for example, transmitting RF signal frequencies up to 50 GHz), low insertion loss, and low reflection RF connection in a BGA package without having to resort to very small ball sizes or the cost and size penalty of avoiding balls altogether by mounting connectors on the package. Embodiments may reduce capacitance to the BGA ball by using large diameter clearance for the outside ground and moving or depopulating certain ground protrusions. Embodiments may maintain a 50 Ohm impedance (or other desired characteristic impedance) through the package and reduce parasitic elements that limit bandwidth by reducing step changes in the diameters of the inner and outer conductors.

IC package substrates typically employ very small vias on the outer layers to facilitate connection to small IC geometries and to help redistribute signals from a small pitch IC to a larger pitch circuit board. For a high-density interconnect package that uses buildup layers laminated to a thicker core layer or layers, the core via may be much larger than the buildup via. BGA pads may also be much larger than buildup vias. When small vias are used to connect to large pads or large vias, parasitic inductive and capacitive effects result, which limit RF performance and which are difficult to compensate. Hence, using an array of buildup vias may make it possible to taper the diameter of the center conductor more gradually, thereby improving RF transmission characteristics. Furthermore, when capacitance to large balls or pads has been reduced by increasing the distance to grounded conductors the resulting impedance of a single small via may be too inductive, and instead, an array of vias can be used to correct the impedance of the path to the desired value.

Embodiments may reduce loss caused by single, small diameter buildup vias by, for example, creating a larger effective diameter conductor using a via array. The larger effective diameter of the center conductor via array may have less resistive loss and may be able to handle higher power than a center conductor having a smaller effective diameter or a single conductor having the same effective diameter.

Figure 2:
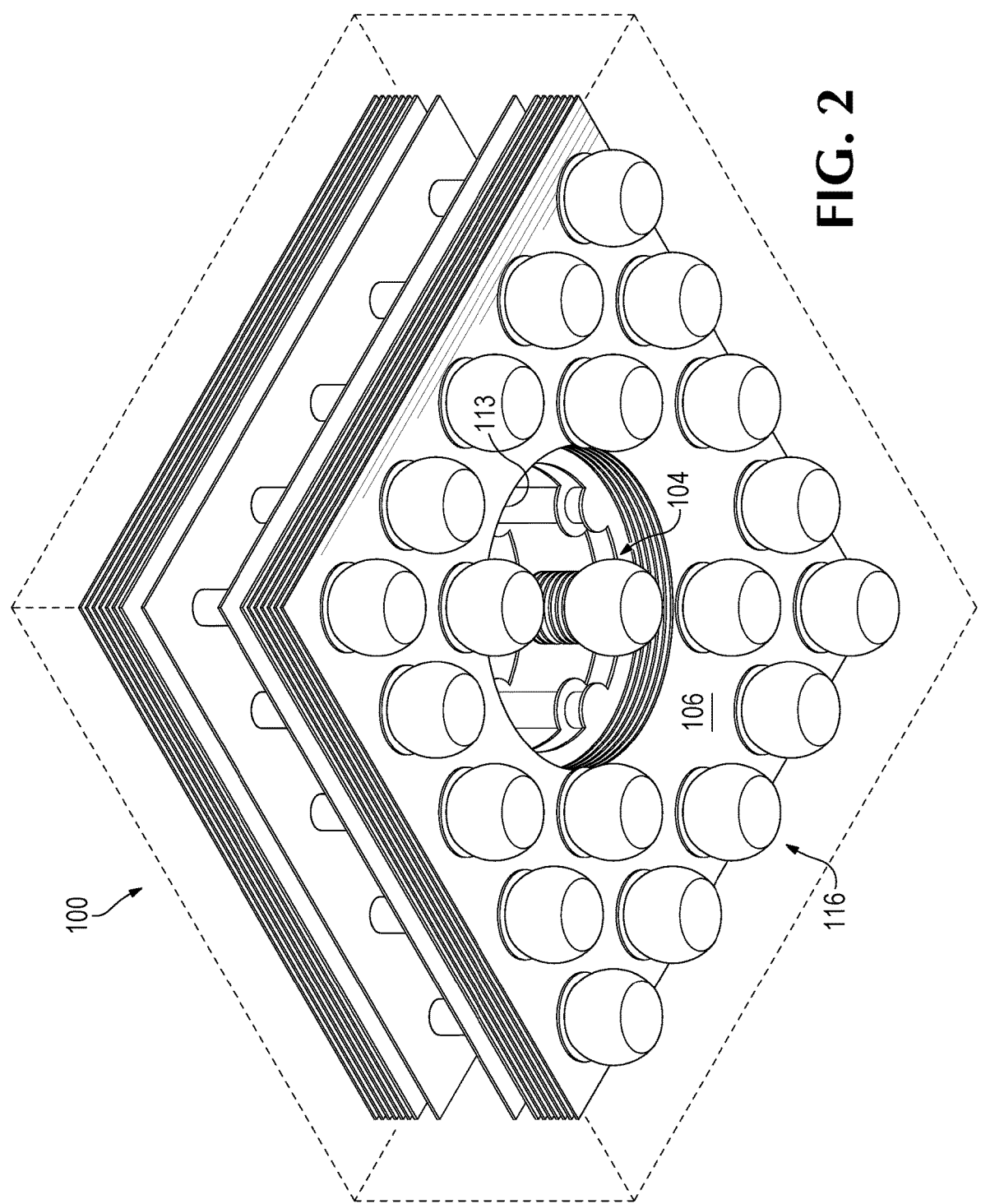
FIG. 2 is a bottom isometric view of the multilayer circuit board of FIG. 1.
Figure 3:
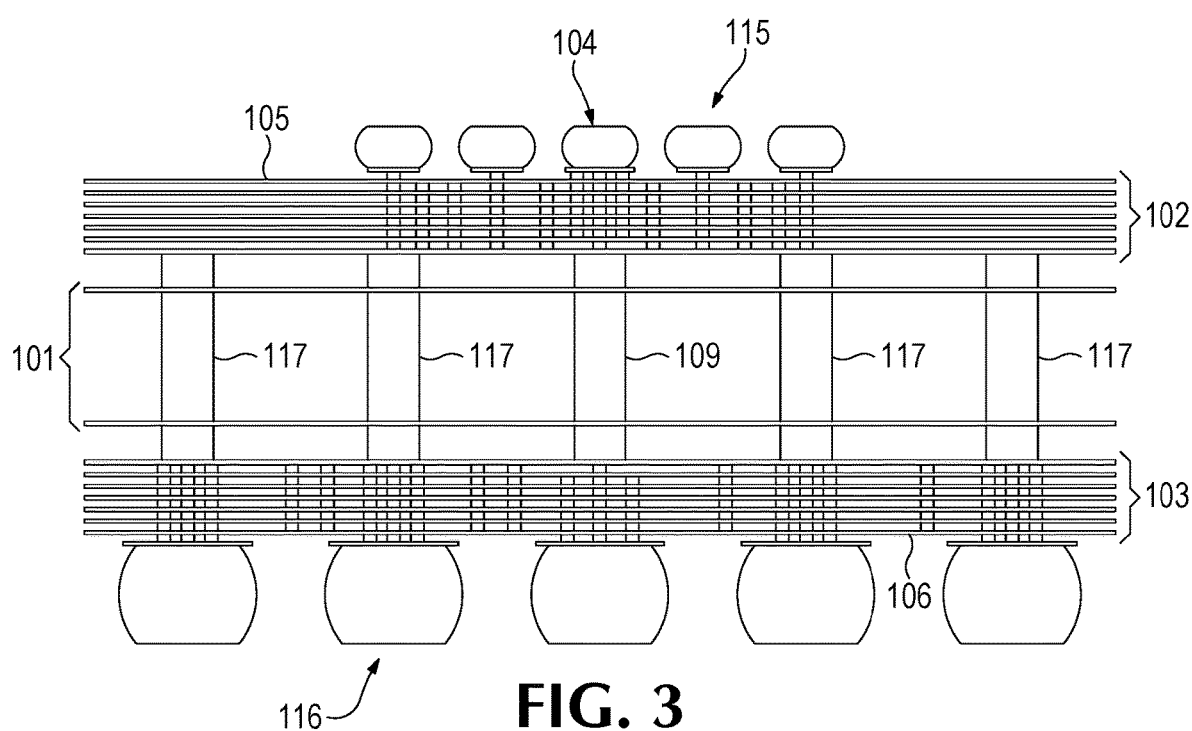
FIG. 3 is a side view of the multilayer circuit board of FIG. 1.
Figure 4:
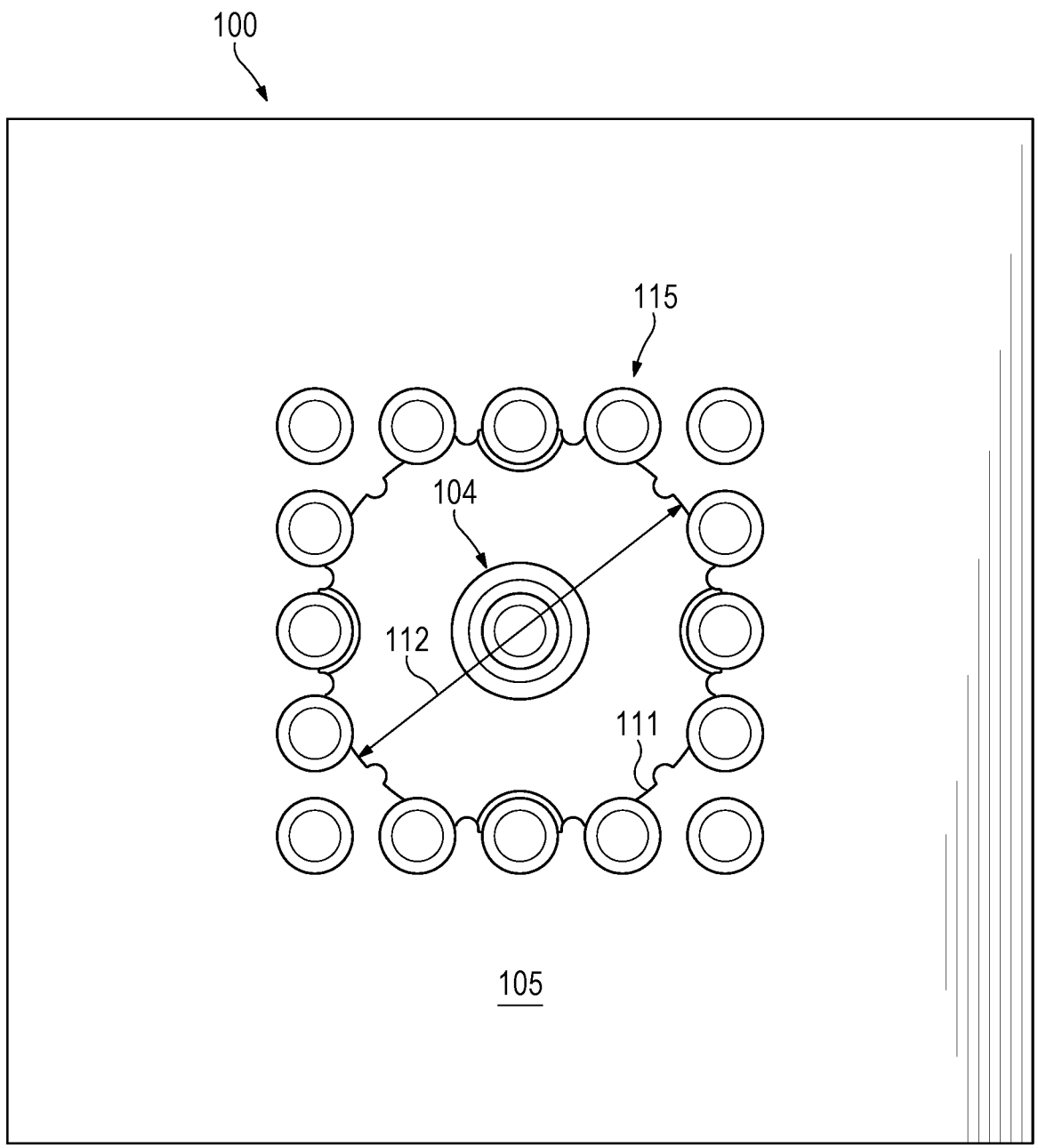
FIG. 4 is a top view of the multilayer circuit board of FIG. 1.
Figure 5:
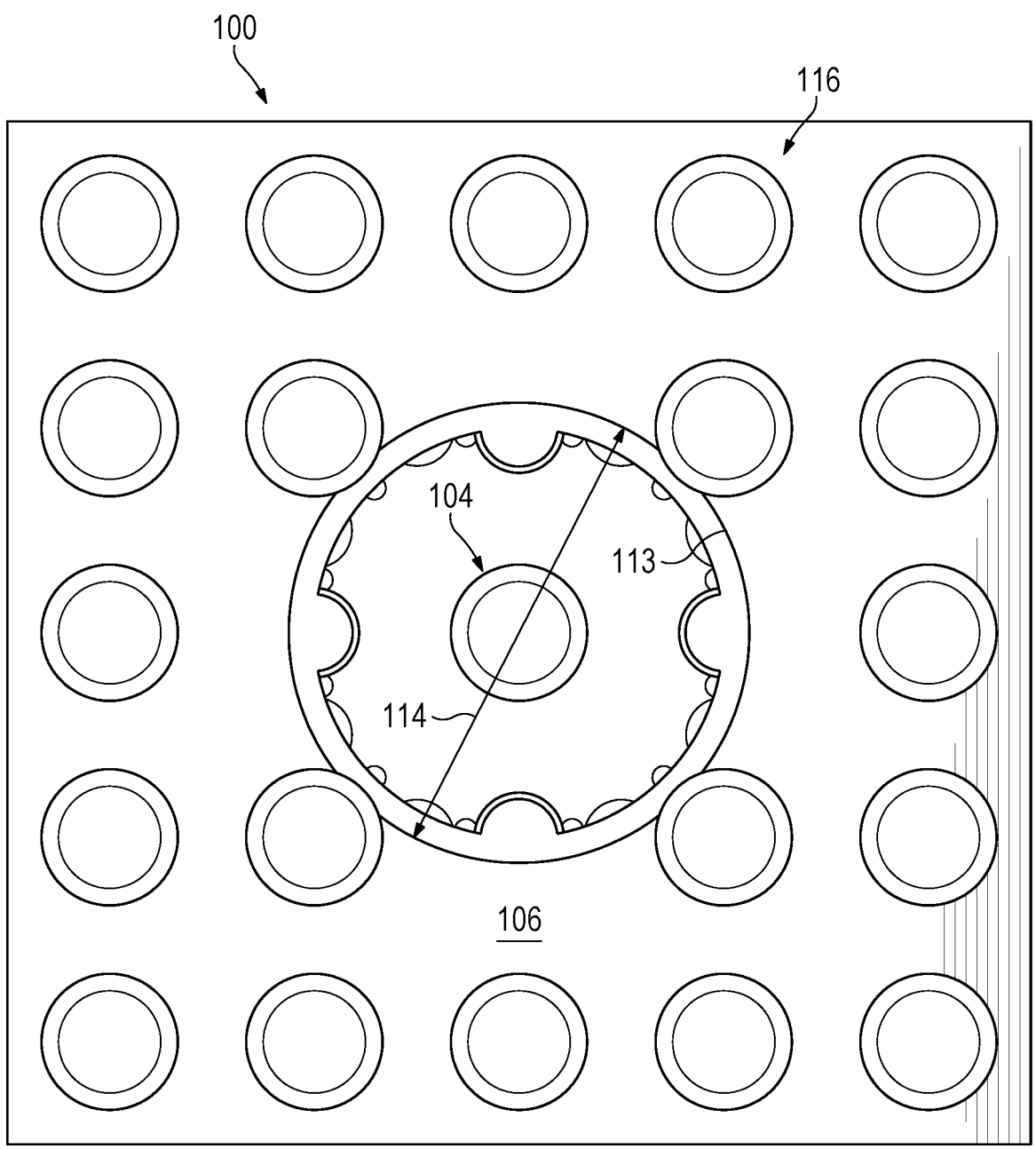
FIG. 5 is a bottom view of the multilayer circuit board of FIG. 1.

FIG. 1 is a top isometric view showing portions of a multilayer circuit board 100, according to embodiments. FIG. 2 is a bottom isometric view of the multilayer circuit board 100 of FIG. 1. FIG. 3 is a side view of the multilayer circuit board 100 of FIG. 1. FIG. 4 is a top view of the multilayer circuit board 100 of FIG. 1. FIG. 5 is a bottom view of the multilayer circuit board 100 of FIG. 1. As illustrated in FIGS. 1-5, a multilayer circuit board 100 may include core layers 101, a first set of alternating layers 102, a second set of alternating layers 103, and a central conductor 104.

The core layers 101 may be between the first set of alternating layers 102 and the second set of alternating layers 103. The core layers 101 may include, for example, one or more conductive layers. The core layers 101 may also include one or more layers of core material, such as a glass epoxy multilayer material.

In embodiments, there may be no core layers 101. In such embodiments, the first set of alternating layers 102 and the second set of alternating layers 103 may be a single set of alternating layers.

The first set of alternating layers 102 may include one or more conductor layers and one or more dielectric layers. The one or more dielectric layers may be or include one or more buildup layers.

FIG. 6 is a table showing certain layer properties of an exemplary multilayer circuit board 100, according to embodiments.

In FIG. 6, solder mask layers are identified as "Solder-mask", dielectric layers are identified as "BU" or "Core," and layers used for signal, signal return/ground, and power are identified as "Conductor." In a high-density interconnect employing buildup and core layers the layer configuration may be described in the form A-B-C, where A, B, and C are the total number of conductor layers in the first section (or set) of alternating layers (or buildup layers) 102, the core layers (or region) 101, and the second section (or set) of alternating layers (or buildup layers) 103, respectively. The layer configuration in FIG. 6 shows several possible configurations, and other configurations may also be used. For example, other possible configurations include a 6-2-6 configuration, a 7-2-7 configuration, and an 8-4-8 configuration.

Figure 7:
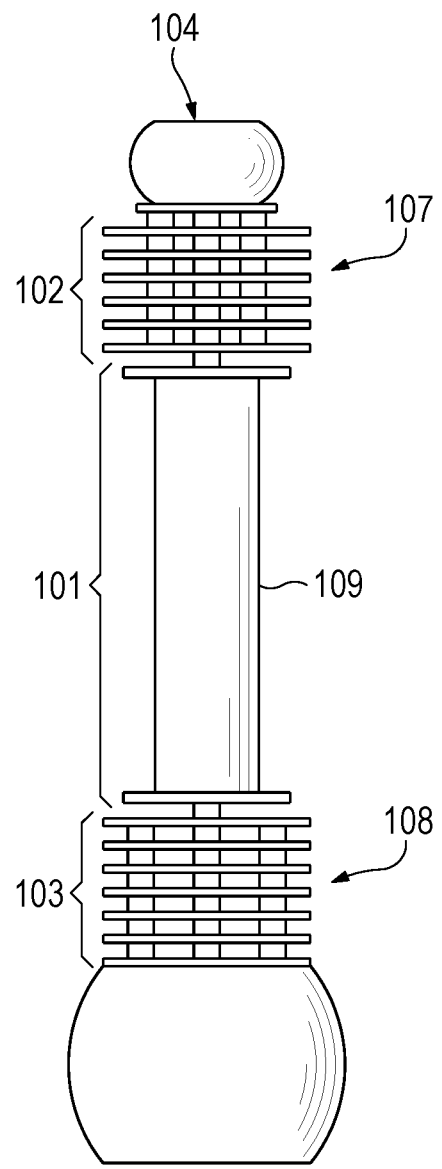
FIG. 7 is a side view of the central conductor of FIG. 1, shown in isolation.

Returning to FIGS. 1-5, the central conductor 104 may extend from a first side 105 of the multilayer circuit board 100, through the first set of alternating layers 102, through the one or more core layers 101, and through the second set of alternating layers 103, to a second side 106 of the multilayer circuit board 100. In other embodiments, FIG. 7 is a side view of the central conductor 104 of FIG. 1, shown in isolation. As illustrated in FIG. 7, the central conductor 104 may include a first compound via 107 through the first set of alternating layers 102, and a second compound via 108 through the second set of alternating layers 103. The central conductor 104 may include a single via 109 through the one or more core layers 101. As illustrated in FIG. 7, the central conductor 104 may also include a solder ball, bump, protrusion, pad, or other component mounting surface at each end. In some embodiments, such as in embodiments where the ends of the central conductor 104 are not vertically aligned, the central conductor 104 may also include one or more conductive traces or patterns on a conductor layer of the core layers 101, or the sets of alternating layers 102, 103 that connect the first compound via 107 to the second compound via 108, i.e., a "horizontal" connection between compound vias 107, 108 through the multilayer circuit board 100.

In still other embodiments, the central conductor 104 may not extend all the way through the multilayer circuit board 100 as illustrated in FIGS. 1-5, 7, and 10-13. Instead, in these embodiments, the central conductor 104 may comprise a first central conductor 104 that extends from a first side of the multilayer circuit board 100 through some number of layers of the multilayer circuit board, a second central conductor 104 that extends from the same side of the multilayer circuit board 100 through the same number or a different number of layers of the multilayer circuit board 100, and a trace on a conductor layer of the multilayer circuit board 100 that connects the first and second central conductors 104. These embodiments may be useful in cases where a signal needs to be conveyed into one side and back out the same side of the multilayer circuit board 100.

In some embodiments, the central conductor 104 may convey a single-ended signal that is referenced to ground. In other embodiments, the central conductor 104 may comprise a pair of central conductors configured to convey a differential signal.

The term "compound via" as used in this disclosure means more than one via operating in parallel. FIGS. 8A-8K are cross-sectional views showing example configurations for compound vias, according to embodiments. With respect to FIGS. 8A-8K, "configuration" means the number of individual vias 110, 118 in the compound via as well as the arrangement of those individual vias 110, 118. As illustrated, the compound via may include three to nineteen individual vias 110, 118, although other configurations having fewer or more individual vias 110, 118 are also possible. In configurations having a centered via 118 (such as the example configurations shown if FIGS. 8C, 8D, 8E, 8F, and 8K), the centered via 118 may be optional.

In configurations in which the compound via includes three or more individual vias 110, 118, each individual via 110, 118 of the first compound via 107 need not continuously extend through the first set of alternating layers 102. Likewise, each individual via 110, 118 of the second compound via 108 need not continuously extend through the second set of alternating layers 103. Instead, a given individual via 110, 118 may be discontinuous, occurring on fewer than all of the layers. Such discontinuities in the individual vias 110, 118 may provide several advantages. For example, vias generally cannot be stacked on each other more than what is allowed by the manufacturer of the high-density interconnect. The compound via, however, permits skipping a via in one layer, a different via in the next layer, and so on so that connectivity and correct diameter is maintained, while avoiding stacking more vias than the manufacturer allows to be stacked.

The first compound via 107 and the second compound via 108 may have the same configuration, or the first compound via 107 and the second compound via 108 may have different configurations.

Returning to FIGS. 1-5, a first gap 111 may surround the central conductor 104 and extend from the first side 105 of the multilayer circuit board 100, through the first set of alternating layers 102, to the one or more core layers 101. The first gap 111 has a first nominal diameter 112 at the first side 105 of the multilayer circuit board 100. A second gap 113 may surround the central conductor 104 and extend from the second side 106 of the multilayer circuit board 100, through the second set of alternating layers 103, to the one or more core layers 101. The second gap 113 has a second nominal diameter 114 at the second side 106 of the multilayer circuit board 100.

As illustrated in FIGS. 1-5, the first diameter 112 and the second diameter 114 may be substantially equal. As used in this disclosure, "substantially equal" means largely or essentially the same without requiring exact equality. In one particular exemplary embodiment, the first diameter 112 and the second diameter 114 are both approximately 1600 micrometers. In other embodiments, the first diameter 112 and the second diameter 114 may be unequal. In other words, the first diameter 112 may be either larger or smaller than the second diameter 114.

A first array of ground protrusions 115 may surround the first gap 111 and be arranged in a first grid pattern on the first side 105 of the multilayer circuit board 100. Each ground protrusion in the first array of ground protrusions 115 may be, for example, a ball, a bump, a pillar, a pin, or other similar projection. The first array of ground protrusions 115 may be, for example, deposited on a corresponding array of pads on the first side 105 of the multilayer circuit board 100. The first side 105 of the multilayer circuit board 100 may, in some embodiments, be identified as the flip-chip side.

A second array of ground protrusions 116 may surround the second gap 113 and be arranged in a second grid pattern on the second side 106 of the multilayer circuit board 100. Each ground protrusion in the second array of ground protrusions 116 may be, for example, a ball, a bump, a pillar, a pin, or other similar projection. The second array of ground protrusions 116 may be, for example, deposited on a corresponding array of pads on the second side 106 of the multilayer circuit board 100. The second side 106 of the multilayer circuit board 100 may, in some embodiments, be identified as the BGA side.

A ground path 117 may connect the first array of ground protrusions 115 to the second array of ground protrusions 116 through the first set of alternating layers 102 and the second set of alternating layers 103. The ground path 117 may include traces or patterns on a conductor layer of any of alternating layers 102, 103 or core layers 101. The ground path 117 may also include vias between layers, such as through core layers 101 as depicted in FIG. 7. In this way, the center conductor 104 being surrounded by vias 117 forms a coaxial-like signal transmission structure through the multilayer circuit board 100.

Figure 9:
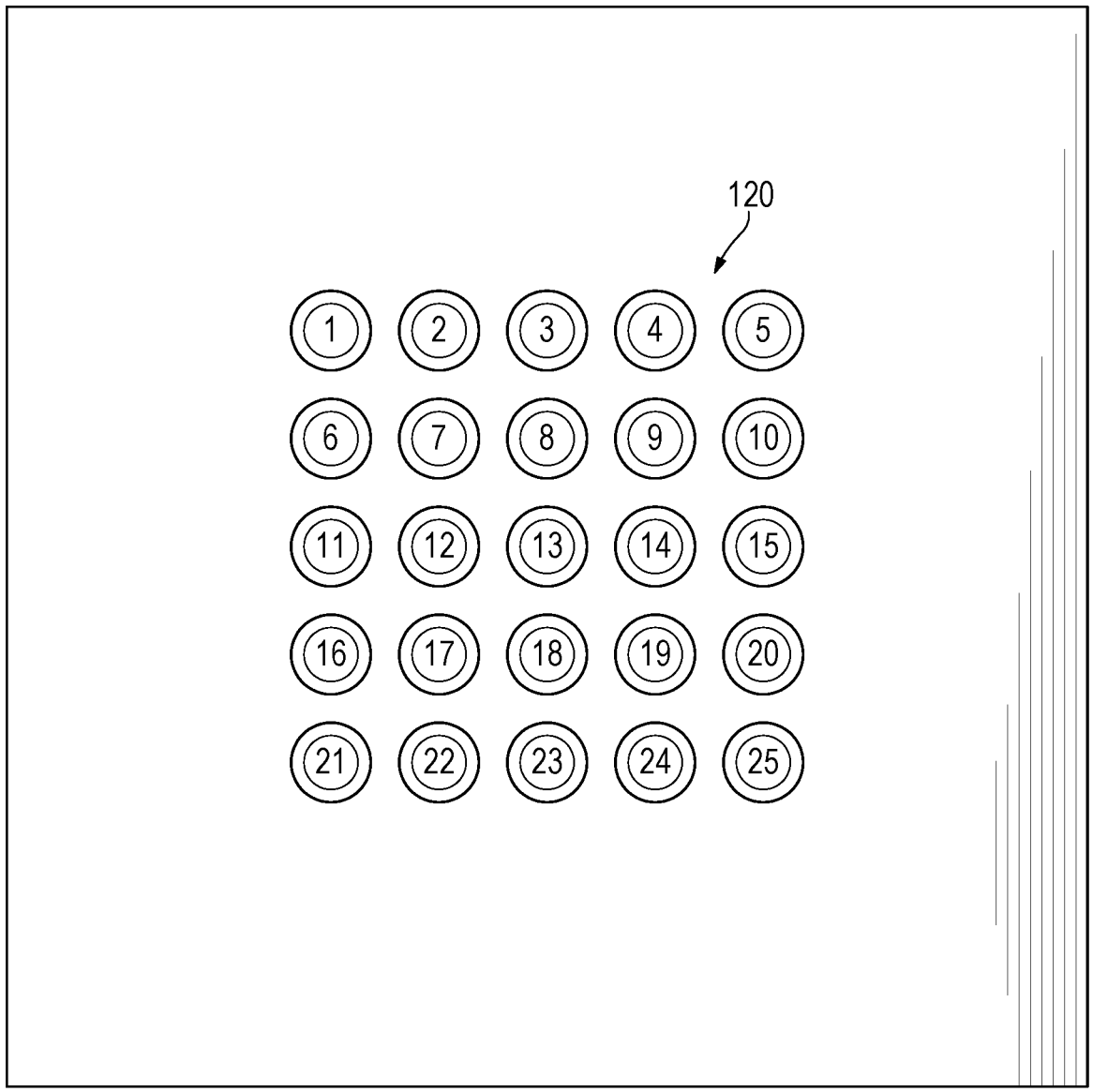
FIG. 9 shows an exemplary five-by-five grid used to describe exemplary configurations for a first side of the multilayer circuit board and a second side of the multilayer circuit board.

FIG. 9 shows an exemplary five-by-five grid 120 used here to describe exemplary configurations for the first side 105 of the multilayer circuit board 100 and the second side 106 of the multilayer circuit board 100. The grid positions are labeled 1-25 to facilitate the discussion. Although exemplary embodiments are discussed with reference to the regularly-spaced grid 120, other configurations for the first array of ground protrusions 115 and the second array of ground protrusions 116 are also possible, such as a staggered array or a circular array. Although the term "ground" is used with respect to the first array of ground protrusions 115 and the second array of ground protrusions 116, in some embodiments these protrusions, and the ground path 117 connecting them, may be at an electrical potential other than the ground reference potential, as would be understood by one of ordinary skill in the art.

With reference to FIG. 9, the first side 105 of the multilayer circuit board 100 of FIGS. 1-5 may be configured as having the central conductor 104 at position 13 and with positions 7-9, 12, 14, and 17-19 depopulated. In other words, there are no ground protrusions at those locations. In embodiments, positions 1, 5, 21, and 25 may also be depopulated (in addition to positions 7-9, 12, 14, and 17-19).

With continued reference to FIG. 9, the second side 106 of the multilayer circuit board 100 of FIGS. 1-5 may be configured as having the central conductor 104 at position 13 and with positions 8, 12, 14, and 18 depopulated. In other embodiments, positions 1, 5, 21, and 25 may also be depopulated (in addition to positions 8, 12, 14, and 18). In still other embodiments, positions 1, 2, 4-6, 10, 16, 20-22, 24, and 25 may also be depopulated (in addition to positions 8, 12, 14, and 18).

Figure 10:
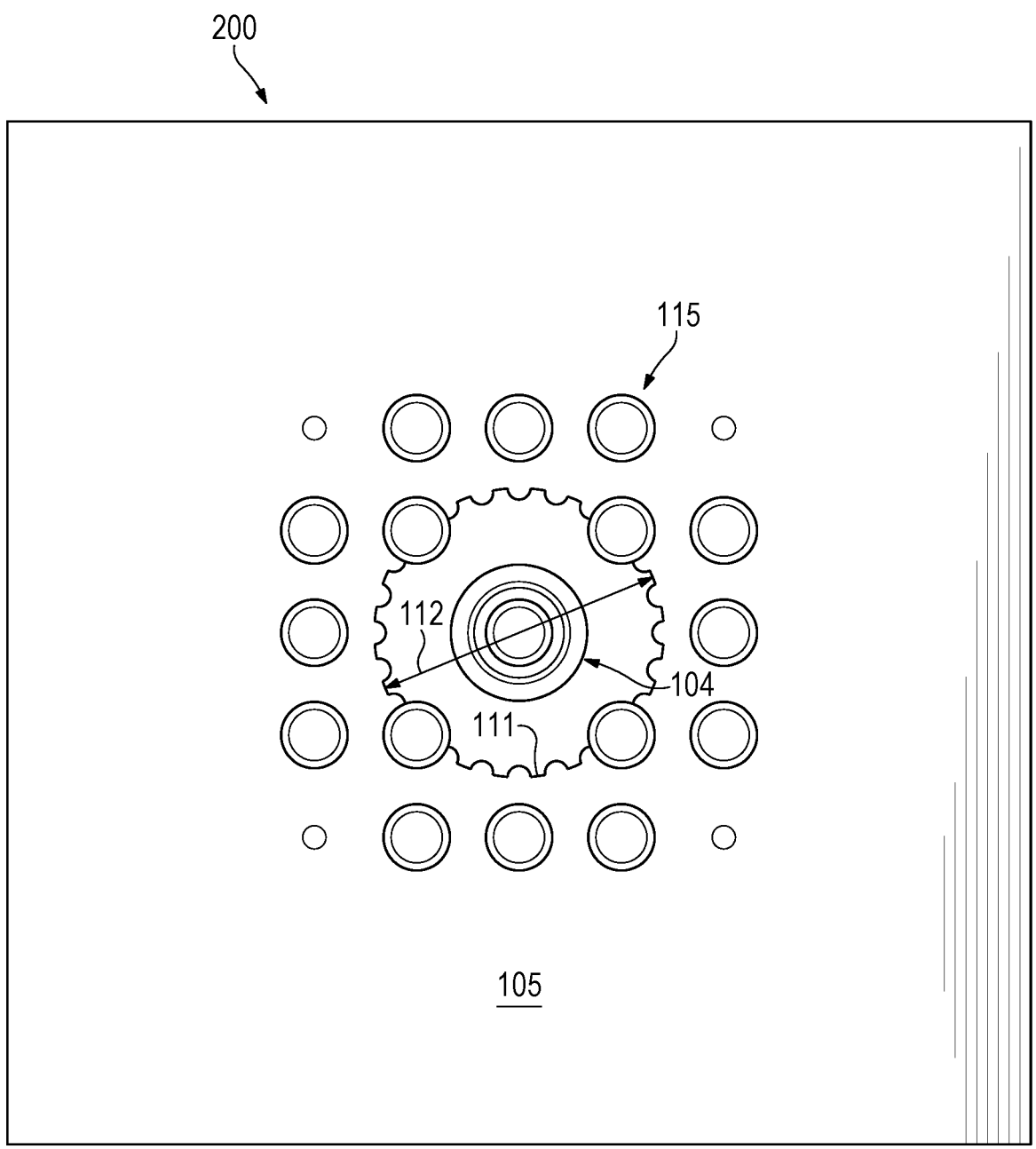
FIG. 10 is a top view of a multilayer circuit board, according to embodiments.
Figure 11:
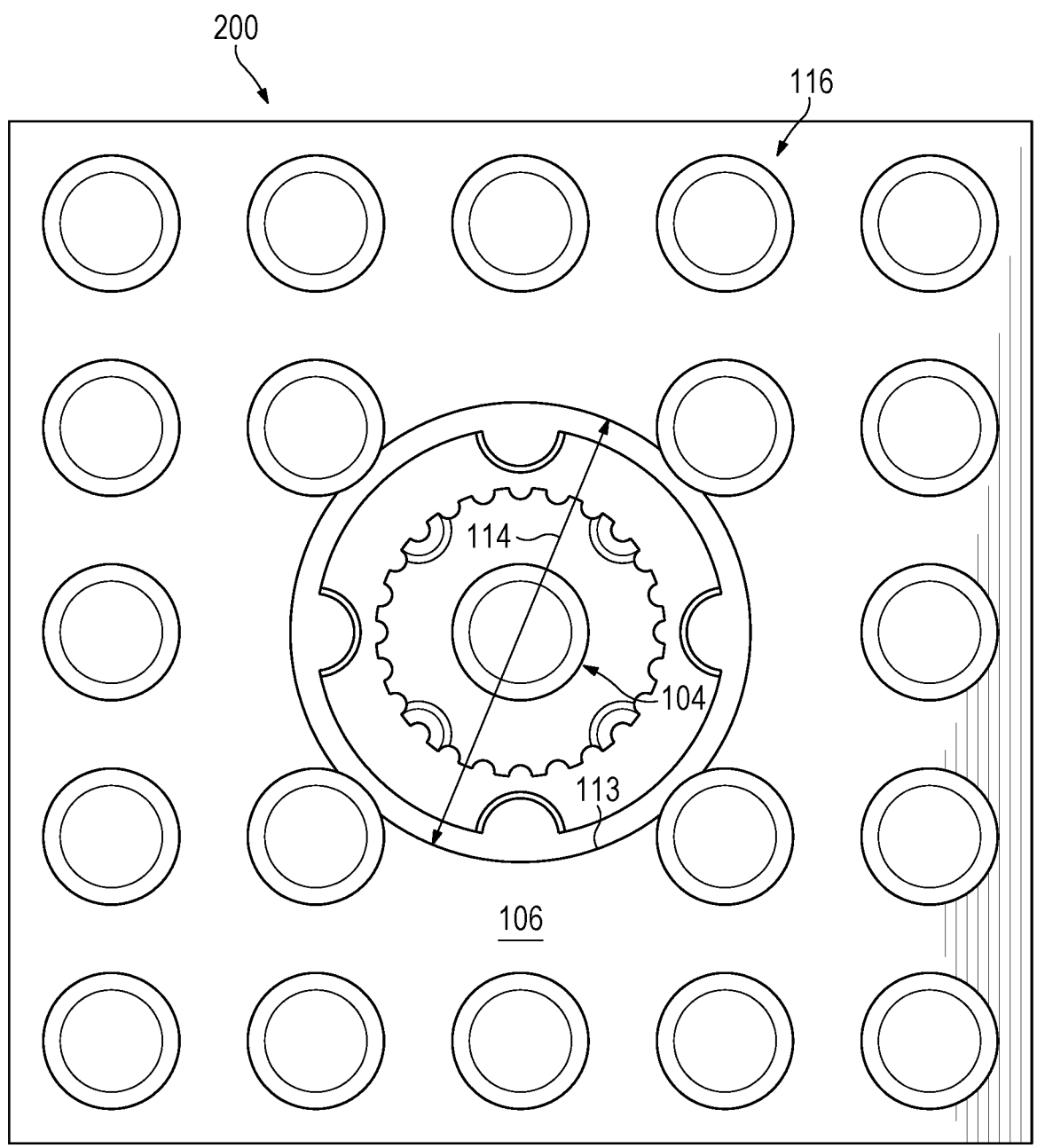
FIG. 11 is a bottom view of the multilayer circuit board of FIG. 10.

FIG. 10 is a top view of a multilayer circuit board 200, according to embodiments. FIG. 11 is a bottom view of the multilayer circuit board 200 of FIG. 10. The multilayer circuit board 200 of FIGS. 10-11 may be substantially identical to the multilayer circuit board 100 of FIGS. 1-5, except as noted here.

As illustrated in FIGS. 10-11, the first diameter 112 of the first gap 111 may be smaller than the second diameter 114 of the second gap 113. For example, the first diameter 112 may be about 20% to about 60% smaller than the second diameter 114.

With reference to FIG. 9, the first side 105 of the multilayer circuit board 200 of FIGS. 10-11 may be configured as having the central conductor 104 at position 13 and with positions 8, 12, 14, and 18 depopulated. In embodiments (and as illustrated in FIG. 10), positions 1, 5, 21, and 25 may also be depopulated (in addition to positions 8, 12, 14, and 18).

With continued reference to FIG. 9, the second side 106 of the multilayer circuit board 200 of FIGS. 10-11 may be configured as having the central conductor 104 at position 13 and with positions 8, 12, 14, and 18 depopulated, as illustrated in FIG. 11. In other embodiments, positions 1, 5, 21, and 25 may also be depopulated (in addition to positions 8, 12, 14, and 18). In still other embodiments, positions 1, 2, 4-6, 10, 16, 20-22, 24, and 25 may also be depopulated (in addition to positions 8, 12, 14, and 18).

Figure 12:
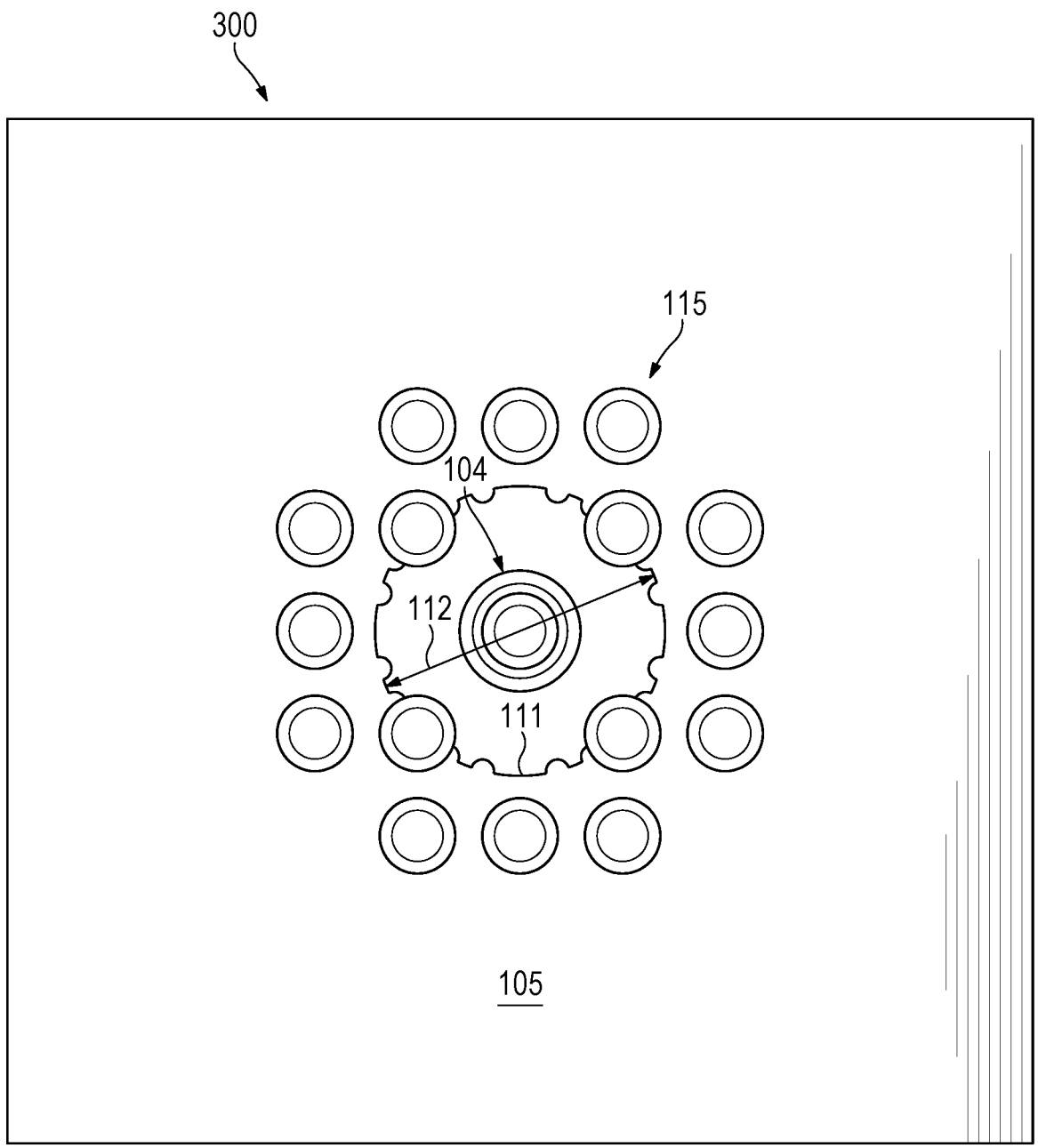
FIG. 12 is a top view of a multilayer circuit board, according to embodiments.
Figure 13:
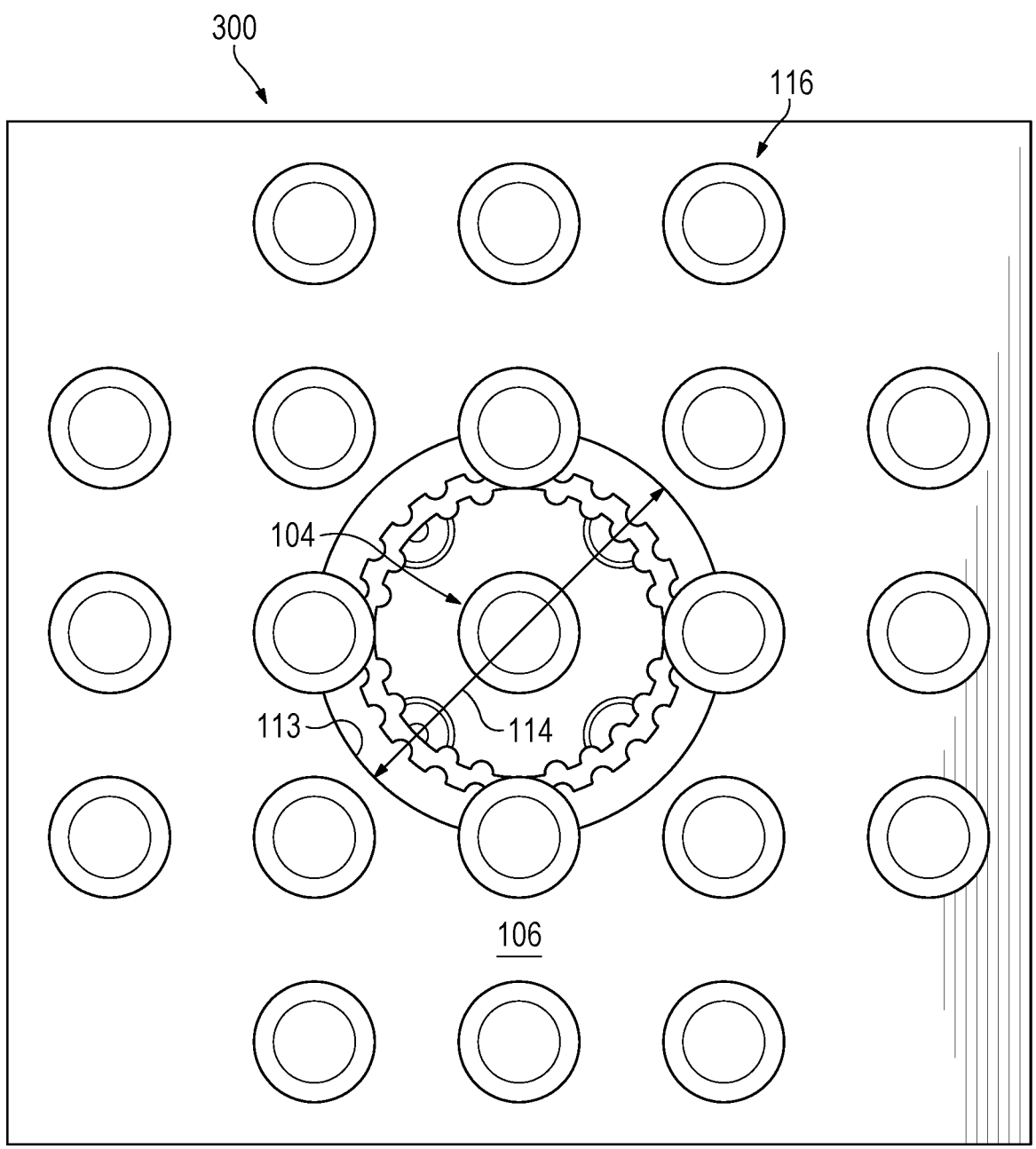
FIG. 13 is a bottom view of the multilayer circuit board of FIG. 12.

FIG. 12 is a top view of a multilayer circuit board 300, according to embodiments. FIG. 13 is a bottom view of the multilayer circuit board 300 of FIG. 12. The multilayer circuit board 300 of FIGS. 12-13 may be identical to the multilayer circuit board 200 of FIGS. 10-11, except as noted here.

With reference to FIG. 9, the first side 105 of the multilayer circuit board 300 of FIGS. 12-13 may be configured as having the central conductor 104 at position 13 and with positions 8, 12, 14, and 18 depopulated. In embodiments (and as illustrated in FIG. 12), positions 1, 5, 21, and 25 may also be depopulated (in addition to positions 8, 12, 14, and 18).

With continued reference to FIG. 9, the second side 106 of the multilayer circuit board 300 of FIGS. 12-13 may be configured as having the central conductor 104 at position 13 and with no positions depopulated. In other embodiments (and as illustrated in FIG. 13), positions 1, 5, 21, and 25 may be depopulated. In still other embodiments, positions 1, 2, 4-6, 10, 16, 20-22, 24, and 25 may be depopulated.

Figure 14:
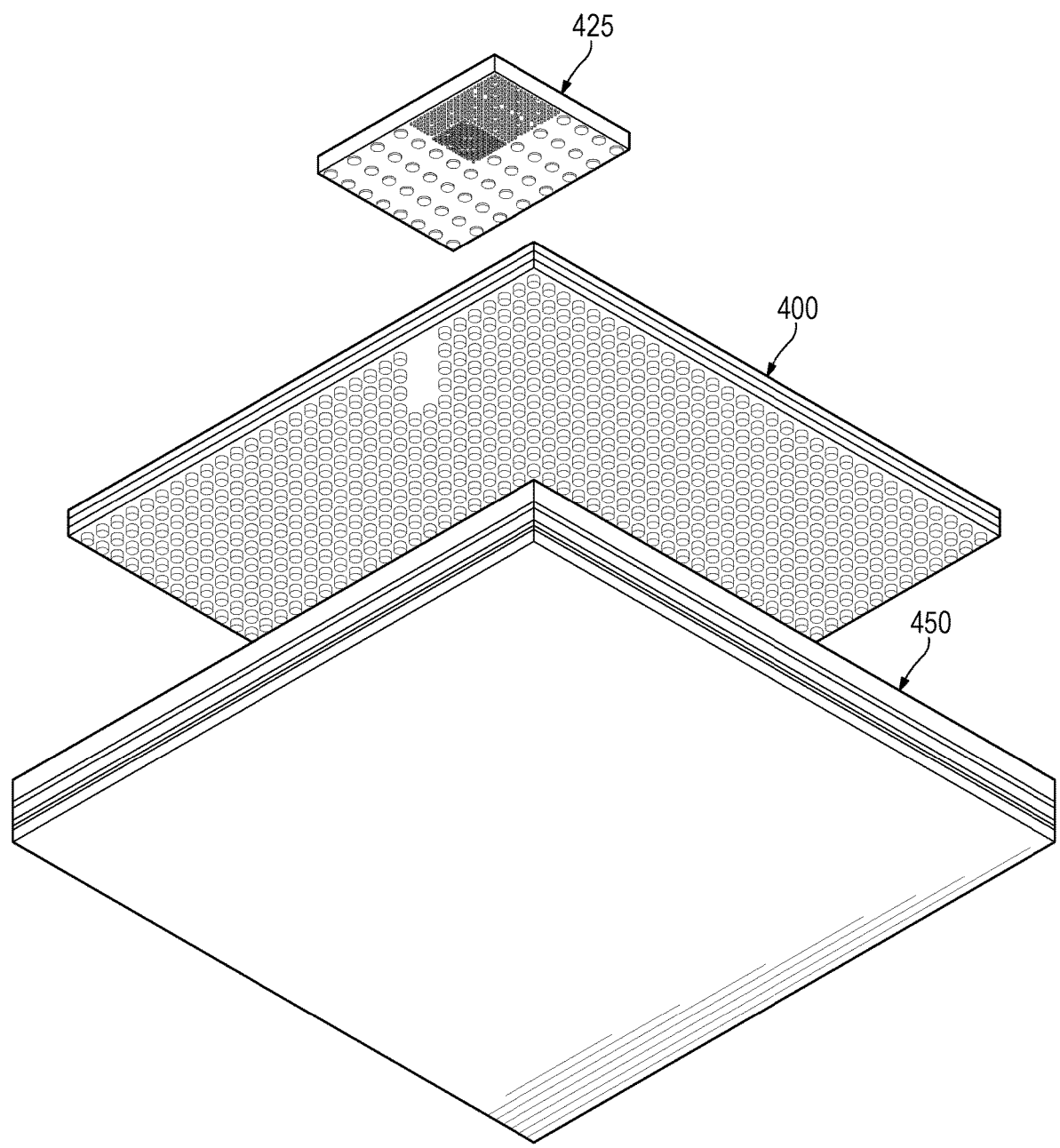
FIG. 14 is an isometric, exploded view of a multilayer circuit board, according to embodiments, together with an example integrated circuit mountable to the multilayer circuit board, and an example printed circuit board to which the multilayer circuit board may be mounted.

FIG. 14 is an isometric, exploded view of a multilayer circuit board 400 with an example integrated circuit 425 and an example printed circuit board 450. As illustrated in FIG. 14, the multilayer circuit board 400 may be mounted to or between other semiconductor devices, such as an integrated circuit 425 and a printed circuit board 450. The multilayer circuit board 400 may be, for example, the multilayer circuit board 100 of FIGS. 1-5, the multilayer circuit board 200 of FIGS. 10-11, or the multilayer circuit board 300 of FIGS. 12-13. Note that FIG. 14 does not show a gap surrounding a central conductor. Rather, any of the balls on the bottom side of the multilayer circuit board 400 illustrated in FIG. 14 may be configured as the central conductor, having the associated gap and associated array of ground protrusions formed around it.

EXAMPLES

Illustrative examples of the disclosed technologies are provided below. An embodiment of the technologies may include one or more, and any combination of, the examples described below.

Example 1 includes a multilayer circuit board comprising: one or more core layers between a first set of alternating layers and a second set of alternating layers, each of the one or more core layers, the first set of alternating layers, and the second set of alternating layers comprising one or more conductor layers and one or more dielectric layers; a central conductor extending from a first side of the multilayer circuit board, through the first set of alternating layers, the one or more core layers, and the second set of alternating layers, to a second side of the multilayer circuit board, the central conductor comprising a first compound via through the first set of alternating layers, and a second compound via through the second set of alternating layers; a gap surrounding the central conductor and extending from the first side of the multilayer circuit board to the second side of the multilayer circuit board; a first array of ground protrusions surrounding the gap and arranged in a first pattern on the first side of the multilayer circuit board; a second array of ground protrusions surrounding the gap and arranged in a second pattern on the second side of the multilayer circuit board; and a ground path connecting the first array of ground protrusions to the second array of ground protrusions through the first set of alternating layers and the second set of alternating layers.

Example 2 includes the multilayer circuit board of Example 1, in which the central conductor further comprises a single via through the one or more core layers.

Example 3 includes the multilayer circuit board of any of Examples 1-2, in which the first compound via comprises a first array of at least three vias operating in parallel.

Example 4 includes the multilayer circuit board of any of Examples 1-2, in which the second compound via comprises a second array of at least three vias operating in parallel.

Example 5 includes the multilayer circuit board of Example 3, in which at least one via in the first array of at least three vias is discontinuous through the first set of alternating layers.

Example 6 includes the multilayer circuit board of Example 4, in which at least one via in the second array of at least three vias is discontinuous through the second set of alternating layers.

Example 7 includes the multilayer circuit board of any of Examples 1-6, in which the central conductor further comprises a trace on a conductor layer connecting the first compound via to the second compound via.

Example 8 includes the multilayer circuit board of any of Examples 1-7, in which the first pattern is a first grid pattern.

Example 9 includes the multilayer circuit board of any of Examples 1-8, in which the second pattern is a second grid pattern.

Example 10 includes the multilayer circuit board of any of Examples 1-9, in which each of the first set of alternating layers or the second set of alternating layers comprises a repeating pattern of conductor-dielectric-conductor-dielectric layers.

Example 11 includes a multilayer circuit board comprising: one or more core layers between a first set of alternating layers and a second set of alternating layers, each of the one or more core layers, the first set of alternating layers, and the second set of alternating layers comprising one or more conductor layers and one or more dielectric layers; a central conductor extending from a first side of the multilayer circuit board, through the first set of alternating layers, the one or more core layers, and the second set of alternating layers, to a second side of the multilayer circuit board; a first gap having a first diameter at the first side of the multilayer circuit board, the first gap surrounding the central conductor and extending from the first side of the multilayer circuit board to the one or more core layers; a second gap having a second diameter at the second side of the multilayer circuit board, the second gap surrounding the central conductor and extending from the second side of the multilayer circuit board to the one or more core layers, the first diameter and the second diameter being unequal; a first array of ground protrusions surrounding the first gap and arranged in a first pattern on the first side of the multilayer circuit board; a second array of ground protrusions surrounding the second gap and arranged in a second pattern on the second side of the multilayer circuit board; and a ground path connecting the first array of ground protrusions to the second array of ground protrusions through the first set of alternating layers and the second set of alternating layers.

Example 12 includes the multilayer circuit board of Example 11, the central conductor comprising a first compound via through the first set of alternating layers, and a second compound via through the second set of alternating layers.

Example 13 includes the multilayer circuit board of Example 12, in which the first compound via comprises a first array of at least three vias operating in parallel.

Example 14 includes the multilayer circuit board of Example 12, in which the second compound via comprises a second array of at least three vias operating in parallel.

Example 15 includes the multilayer circuit board of Example 13, in which at least one via in the first array of at least three vias is discontinuous through the first set of alternating layers.

Example 16 includes the multilayer circuit board of Example 14, in which at least one via in the second array of at least three vias is discontinuous through the second set of alternating layers.

Example 17 includes the multilayer circuit board of any of Examples 12-16, in which the central conductor further comprises a trace on a conductor layer connecting the first compound via to the second compound via.

Example 18 includes the multilayer circuit board of any of Examples 11-17, in which the central conductor further comprises a single via through the one or more core layers.

Example 19 includes the multilayer circuit board of any of Examples 11-18, in which the central conductor comprises a pair of central conductors configured to convey a differential signal.

Example 20 includes the multilayer circuit board of any of Examples 11-19, in which the first diameter is about 20% to about 60% smaller than the second diameter.

Example 21 includes the multilayer circuit board of any of Examples 11-20, in which the first pattern is a first grid pattern.

Example 22 includes the multilayer circuit board of any of Examples 11-21, in which the second pattern is a second grid pattern.

Example 23 includes the multilayer circuit board of any of Examples 11-22, in which each of the first set of alternating layers the second set of alternating layers comprises a repeating pattern of conductor-dielectric-conductor-dielectric layers.

Example 24 includes the multilayer circuit board of any of Examples 11-23, in which the central conductor comprises a pair of central conductors configured to convey a differential signal.

Example 25 includes a multilayer circuit board comprising: a set of alternating layers comprising a plurality of conductor layers and one or more dielectric layers; a central conductor extending from a first side of the multilayer circuit board, through the set of alternating layers, to a second side of the multilayer circuit board, the central conductor comprising a compound via through the set of alternating layers; a gap surrounding the central conductor and extending from the first side of the multilayer circuit board to the second side of the multilayer circuit board, the gap having a first diameter at the first side of the multilayer circuit board, the gap having a second diameter at the second side of the multilayer circuit board; a first array of ground protrusions surrounding the gap and arranged in a first pattern on the first side of the multilayer circuit board; a second array of ground protrusions surrounding the gap and arranged in a second pattern on the second side of the multilayer circuit board; and a ground path connecting the first array of ground protrusions to the second array of ground protrusions through the set of alternating layers.

Example 26 includes the multilayer circuit board of Example 25, in which the central conductor further comprises a trace on a conductor layer.

Example 27 includes the multilayer circuit board of any of Examples 25-26, in which the compound via comprises an array of at least three vias operating in parallel.

Example 28 includes the multilayer circuit board of Example 27, in which at least one via in the array of at least three vias is discontinuous through the set of alternating layers.

Example 29 includes the multilayer circuit board of any of Examples 25-27, in which the first pattern is a first grid pattern.

Example 30 includes the multilayer circuit board of any of Examples 25-29, in which the second pattern is a second grid pattern.

Example 31 includes the multilayer circuit board of any of Examples 25-30, in which each the set of alternating layers comprises a repeating pattern of conductor-dielectric-conductor-dielectric layers.

Example 32 includes the multilayer circuit board of any of Examples 25-31, in which the first diameter is substantially equal to the second diameter.

Example 33 includes the multilayer circuit board of any of Examples 25-31, in which the first diameter and the second diameter are unequal.

Example 34 includes the multilayer circuit board of any of Examples 25-32, in which the central conductor comprises a pair of central conductors configured to convey a differential signal.

Example 35 includes a multilayer circuit board comprising: a set of alternating layers comprising a plurality of conductor layers and one or more dielectric layers; a first central conductor extending from a first side of the multilayer circuit board through a first plurality of layers of the set of alternating layers, the first central conductor comprising a first compound via; a second central conductor extending from the first side of the multilayer circuit board through a second plurality of layers of the set of alternating layers, the second central conductor comprising a second compound via; a trace on a conductor layer of the set of alternating layers connecting the first central conductor to the second central conductor; a first gap surrounding the first central conductor and extending from the first side of the multilayer circuit board through the first plurality of layers of the set of alternating layers; a second gap surrounding the second central conductor and extending from the first side of the multilayer circuit board through the second plurality of layers; a first array of ground protrusions surrounding the first gap and arranged in a first pattern; a second array of ground protrusions surrounding the second gap and arranged in a second pattern; and a ground path connecting the first array of ground protrusions to the second array of ground protrusions through the set of alternating layers.

Example 36 includes the multilayer circuit board of Example 35, in which the first plurality of layers is identical to the second plurality of layers.

Example 37 includes the multilayer circuit board of any of Examples 35-36, in which the first compound via comprises an array of at least three vias operating in parallel.

Example 38 includes the multilayer circuit board of any of Examples 35-37, in which the second compound via comprises an array of at least three vias operating in parallel.

Example 39 includes the multilayer circuit board of either of Examples 37-38, in which at least one via in the array of at least three vias is discontinuous through the set of alternating layers.

Example 40 includes the multilayer circuit board of any of Examples 35-39, in which the first gap has a first diameter, the second gap has a second diameter, and in which the first diameter is substantially equal to the second diameter.

Example 41 includes the multilayer circuit board of any of Examples 35-39, in which the first gap has a first diameter, the second gap has a second diameter, and in which the first diameter and the second diameter are unequal.

Example 42 includes the multilayer circuit board of any of Examples 35-41, in which the first pattern is a first grid pattern.

Example 43 includes the multilayer circuit board of any of Examples 35-42, in which the second pattern is a second grid pattern.

Example 44 includes the multilayer circuit board of any of Examples 35-43, in which the set of alternating layers comprises a repeating pattern of conductor-dielectric-conductor-dielectric layers.

Example 45 includes the multilayer circuit board of any of Examples 35-44, in which the central conductor comprises a pair of central conductors configured to convey a differential signal.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect or embodiment, that feature can also be used, to the extent possible, in the context of other aspects and embodiments.

Also, when reference is made in this application to a method having two or more defined steps or operations, the defined steps or operations can be carried out in any order or simultaneously, unless the context excludes those possibilities.

Furthermore, the term "comprises" and its grammatical equivalents are used in this application to mean that other components, features, steps, processes, operations, etc. are optionally present. For example, an article "comprising" or "which comprises" components A, B, and C can contain only components A, B, and C, or it can contain components A, B, and C along with one or more other components.

Although specific embodiments have been illustrated and described for purposes of illustration, it will be understood that various modifications may be made without departing from the spirit and scope of the disclosure. Accordingly, the invention should not be limited except as by the appended claims.

The invention claimed is:

1. A multilayer circuit board comprising:
   one or more core layers between a first set of alternating layers and a second set of alternating layers, each of the one or more core layers, the first set of alternating layers, and the second set of alternating layers comprising one or more conductor layers and one or more dielectric layers;
   a central conductor extending from a first side of the multilayer circuit board, through the first set of alternating layers, the one or more core layers, and the second set of alternating layers, to a second side of the multilayer circuit board;
   a first gap having a first diameter at the first side of the multilayer circuit board, the first gap surrounding the central conductor and extending from the first side of the multilayer circuit board to the one or more core layers, the first gap extending through at least one conductor layer that is a signal layer;
   a second gap having a second diameter at the second side of the multilayer circuit board, the second gap surrounding the central conductor and extending from the second side of the multilayer circuit board to the one or more core layers, the second gap extending through at least one conductor layer that is a signal layer, the first diameter and the second diameter being unequal;
   a first array of ground protrusions surrounding the first gap and arranged in a first pattern on the first side of the multilayer circuit board;
   a second array of ground protrusions surrounding the second gap and arranged in a second pattern on the second side of the multilayer circuit board; and
   a ground path connecting the first array of ground protrusions to the second array of ground protrusions through the first set of alternating layers and the second set of alternating layers.

2. The multilayer circuit board of claim 1, the central conductor comprising a first compound via through the first set of alternating layers, and a second compound via through the second set of alternating layers.

3. The multilayer circuit board of claim 2, in which the first compound via comprises a first array of at least three vias operating in parallel, and in which the second compound via comprises a second array of at least three vias operating in parallel.

4. The multilayer circuit board of claim 3, in which at least one via in the first array of at least three vias is discontinuous through the first set of alternating layers.

5. The multilayer circuit board of claim 3, in which at least one via in the second array of at least three vias is discontinuous through the second set of alternating layers.

6. The multilayer circuit board of claim 2, in which the central conductor further comprises a trace on a conductor layer connecting the first compound via to the second compound via.

7. The multilayer circuit board of claim 1, in which the central conductor further comprises a single via through the one or more core layers.

8. The multilayer circuit board of claim 1, in which the central conductor comprises a pair of central conductors configured to convey a differential signal.

* * * * *